US007122463B2

(12) United States Patent
Ohuchi

(10) Patent No.: US 7,122,463 B2
(45) Date of Patent: Oct. 17, 2006

(54) MANUFACTURING METHOD OF SEMICONDUCTOR DEVICE

(75) Inventor: Masahiko Ohuchi, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 98 days.

(21) Appl. No.: 10/834,247

(22) Filed: Apr. 29, 2004

(65) Prior Publication Data

US 2004/0219780 A1    Nov. 4, 2004

(30) Foreign Application Priority Data

Apr. 30, 2003    (JP) .............................. 2003-125106

(51) Int. Cl.
*H01L 21/4763* (2006.01)
(52) U.S. Cl. ...................... 438/624; 438/622; 438/637; 438/639; 257/E21.538
(58) Field of Classification Search ................ 438/622, 438/624, 637, 639
See application file for complete search history.

(56) References Cited

U.S. PATENT DOCUMENTS 6,200,735 B1 *   3/2001   Ikegami ...................... 430/314
6,255,161 B1 *   7/2001   Lin ............................. 438/254
6,300,238 B1 *  10/2001   Lee et al. ................... 438/624

FOREIGN PATENT DOCUMENTS

| JP | 10-092935 A | 4/1998 |
| JP | 10-294367 A | 11/1998 |
| JP | 11-186225 A | 7/1999 |
| JP | 11-214512 A | 8/1999 |
| JP | 11-354499 A | 12/1999 |

* cited by examiner

*Primary Examiner*—Zandra V. Smith
*Assistant Examiner*—Christy L. Novacek
(74) *Attorney, Agent, or Firm*—Sughrue Mion, PLLC

(57) ABSTRACT

When the occurrence of the bowing is controlled through the etching conditions, a change in etching conditions causes the bowing. Another problem is a requirement of the larger-sized apparatus for the substrate with a larger diameter in order to allow a whole substrate being subjected equally to the conditions under which no bowing occurs.

In the present invention, a first etching is stopped at a depth where no bowing occurs to form an opening section. Next, a protective film for etching is formed on a region of the wall surface of the hole in the opening section where a bowing is liable to appear when an opening is formed further.

After that, a second etching is carried out to form an opening further, and thereby a minute opening with an aspect ratio of 13 or higher is made, while suppressing the occurrence of the bowing well.

10 Claims, 11 Drawing Sheets

MANUFACTURING METHOD OF SEMICONDUCTOR DEVICE

FIELD OF THE INVENTION

The present invention relates to a manufacturing method of a semiconductor device, and more particularly to a method of forming a minute opening in an insulating film overlying a semiconductor substrate.

DESCRIPTION OF THE RELATED ART

In recent years, the degree of integration in the semiconductor integrated circuit device has been advancing with great rapidity. For this progress in integration, the miniaturization of the pattern is an essential condition and various microfabrication techniques to form minute patterns have been being developed.

In the dry etching technique which is, along with the photolithography technique, particularly important among microfabrication techniques, if the pattern is minute and the aspect ratio (the ratio of the diameter or the width of the opening to the depth of the opening) therein is large, the etching rate generally decreases with increasing aspect ratio. However, when the etching is performed in a state with a lowered degree of vacuum, it is possible to suppress the decrease in etching rate with increasing aspect ratios and, as a result, there have been being developed a number of methods which allow stable plasma discharges in a considerably high vacuum region. Through the development of apparatuses capable to generate a plasma with a high density in a high vacuum region (for instance, a region of 1.3 [KPa] or less) by a method such as the ECR (Electron Cyclotron Resonance) method, the ICR (Induction Coupled Plasma) method or the helicon wave excited plasma method, the etching of minuter patterns has become feasible. In dry etching of this sort, the plasma is generated by applying a high frequency electric field to an induced gas and, utilizing the chemical reaction with active particles in the plasma, dry etching is made, and therefore opening sections including minute contact holes can be worked into prescribed vertical forms.

FIGS. 3(a) to (e) are a series of schematic views illustrating, in sequence, the steps of a method of forming a contact hole with an aperture as minute as 0.2 µm or less by the dry etching method utilizing a high density plasma in a high vacuum region, which is described in Japanese Patent Application Laid-open No. 294367/1998. This method shown in FIGS. 3(a) to (e) is a method of forming an opening pattern for a contact hole wherein a polysilicon mask is employed in place of a conventionally used photoresist mask, and a contact hole is formed through the following steps (1) to (5).

(1) The step of FIG. 3(a): On the surface of a silicon substrate 1, a CVD (Chemical Vapor Deposition) insulating film 2 of silicon oxide with a thickness of 500 nm to 1500 nm, and a first polysilicon (Poly-Si) film 3 with a thickness of 150 nm to 300 nm are successively grown by the CVD method. After that, there is formed a photoresist mask 4 being a first hole opening section 4a, formed by means of photolithography. The minimum diameter of the first hole opening section 4a possible to form in this photoresist mask 4 is 0.25 µm or so and this is regarded as the limit for the current photolithography technique.

(2) The step of FIG. 3(b): Next, with the photoresist mask 4 being used as a mask, anisotropic etching by a high density plasma in a high vacuum region is selectively applied onto the first polysilicon film 3 and thereby a second hole opening section 3a is formed in the first polysilicon film 3. The aperture of the second hole opening section 3a formed hereat in the first polysilicon film 3 becomes almost the same (0.25 µm or so) as that of the first hole opening section 4a.

(3) The step of FIG. 3(c): Next, after the photoresist mask 4 is removed by the step of removing the resist, deposition of a second polysilicon film 5 is made to a thickness of 100 nm to 150 nm over the surface of the first polysilicon film 3 as well as the internal surface of the second hole opening section 3a formed in the first polysilicon film 3.

(4) The step of FIG. 3(d): Next, by performing anisotropic etching perpendicular to the surface of the second polysilicon film 5, the second polysilicon film 5 is made to remain only over the surface of the internal wall of the second hole opening section 3a formed in the first polysilicon film 3. The second polysilicon film 5 is, in this way, left only over the surface of the internal wall of the second hole opening section 3a and thereby a third hole opening section 5a having a smaller aperture than the second hole opening section 3a can be formed. For example, if a film thickness of the second polysilicon film 5 is 100 nm, a diameter of the third hole opening section becomes approximately 0.05 µm.

(5) The step of FIG. 3(e): Next, using as a mask, the first polysilicon film 3 wherein the third hole opening section 5a having a smaller aperture than the second hole opening section 3a is formed as described above, the CVD insulating film 2 is anisotropically etched by a high density plasma in a high vacuum region. In this way, a contact hole (an opening section) 2a having an aperture of 0.05 µm, which is still minuter than the aperture of 0.25 µm the second hole opening section 3a has can be formed.

In Japanese Patent Application Laid-open No. 92935/1998, there is described a technique where, similar to that in Japanese Patent Application Laid-open No. 294367/1998, an opening with an aperture that is narrower than the limit of the photolithography is formed by forming a sidewall in an opening section.

In Japanese Patent Application Laid-open No. 92935/1998, an example of forming an opening with an aperture of 0.25 µm that is narrower than an aperture of 0.35 µm for an opening in a mask is given. However, a depth of the opening is not mentioned therein. FIG. 3 and FIG. 8 in Japanese Patent Application Laid-open No. 92935/1998 illustrate examples in which an electrical connection is made with an interconnection lying beneath two layers. With the techniques disclosed in 1996, film thicknesses of the interlayer insulating films normally employed are 1 µm. In this case, the aspect ratio of an opening connected with the interconnection lying beneath two layers must be 8 or so.

Nevertheless, this method has the following problems.

Formation of a minute opening with an aperture of 0.3 µm or less may bring about a deviation in shape called the bowing.

FIG. 4 is a view in explaining a case in which a shape defect by the bowing occurs in the contact hole 2a formed in the afore-mentioned step of 3(a). Namely, when a BPSG (Boro-Phospho-Silicate Glass) film is used as a CVD insulating film 2, a halfway section of the contact hole 2a becomes swollen in the form of an arch, resulting in a bowing phenomenon in which an aperture Tb of the halfway section of the contact hole 2a which is formed through the CVD insulating film 2 becomes greater than an aperture (a mask aperture) Tm of the third hole opening section 5a which is formed by making the second polysilicon film 5 remain on the surface of the internal wall of the second hole opening section 3a in the second polysilicon film 3'. This is considered to take place in the following way. When, on irradiation, electrons and ions which are separated in a plasma reach the surface of the mask for pattern formation, the electrification may be produced in the vicinity of the surface due to a difference between numbers of electrons and ions entering the inside of the minute pattern. This leads to the deflection of the path of the incident ions and, consequently, the collision of some astray ions with the halfway section of the wall surface of the contact hole 2a, and results in etching of the halfway section thereof to bring about the bowing phenomenon.

As shown in FIG. 4, when the maximum value for the aperture of the contact hole 2a formed by etching is denoted by Tb and the distance between the position at which the aperture has the maximum value Tb (the bowing position) and the mask (the obverse surface of the CVD insulating film 2) is denoted by H, the maximum value Tb for the aperture and the distance H vary according to the etching conditions. For instance, when the etching pressure is raised, the maximum value for the aperture becomes smaller and the distance H becomes greater. In the case that the mask aperture Tm is relatively large (not less than 0.3 μm), it is possible to suppress the bowing so as not to cause any problems in practice by setting appropriate etching conditions. Nevertheless, when the mask aperture Tm becomes small (not greater than 0.2 μm), an increase in relative dimension ratio of the maximum value Tb for the aperture to the mask aperture Tm cannot be ignored and various problems may arise.

As a publication set out to solve the problem of the bowing described above, Japanese Patent Application Laid-open No. 354499/1999 can be given. In Japanese Patent Application Laid-open No. 354499/1999, a method of suppressing the occurrence of the bowing by optimizing dry etching conditions is described. As such etching conditions, there are disclosed two, one in which a mixed gas of $CH_3$ and CO is used as an etching gas and the substrate temperature in etching is kept at or above 50° C., and the other in which a mixed gas of $C_4F_8$, $O_2$ and Ar is used as the etching gas and the substrate temperature is set at or below 0° C.

When a bowing occurs, such problems as illustrated in FIG. 7 arise.

In FIG. 7(1), there is depicted an opening with a bowing taking place, to which a capacitor film is applied. The presence of the bowing causes a problem of film interruption in the very place of the bowing. Further, when a bowing occurs, neighbouring openings as shown in FIG. 7(2) may be linked together, and make a short-circuit. Even if no short-circuit is made, the distance between the neighbouring contact holes is shortened so that the parasitic capacitance increases and the device characteristics deteriorate, which are the matter of great concern. Moreover, if a hole with a bowing taking place is filled up with a conductive film, a void as shown in FIG. 7(3) appears in the central section of the hole. With a void being created, a gas in the void may expand and burst up in the later step of heating.

Further, unless a short-circuit state is brought about, the detection of the bowing defects as shown in FIG. 7(2) cannot be done by the nondestructive tests such as DC measurements made during the manufacturing steps. Hereat, the parasitic capacitance increases, and characteristics of the semiconductor LSI (Large Scale Integrated circuit) deteriorate and especially, among them, the attainment of higher speed is hindered. Further, a film interruption of FIG. 7(1) occurred in a capacitor section of a DRAM (Dynamic Random Access Memory) causes a problem of the reduced capacitance and the shortened memory hold time.

When any of the above faulty conditions happens, the defect, therefore, cannot be found until the measurement is made after assembling into the package is completed. Because of this, a method of suppressing the bowing by setting appropriate etching conditions for dry etching has the disadvantage that, once conditions become unfit, not only the success rate of the production drops a great deal but also massive defects spring up.

In conventional techniques, the occurrence of the bowing which appears at the time of formation of an opening with a minute aperture and a high aspect ratio is controlled through etching conditions. The controlling method through etching conditions has the following problems.

The first problem is the necessity to monitor changes in etching conditions all the time, since any change in etching conditions may give rise to a bowing.

The second problem is a possibility that an unexpected change in any etching parameter may produce a bowing.

The third problem occurs when the diameter of the substrate becomes larger. To fabricate such a substrate under conditions that no bowing occurs in the whole substrate, an apparatus required becomes considerably large-sized. None the less, if a smaller-sized apparatus is employed, a range for etching conditions that satisfy the bowing-free conditions becomes narrow.

The fourth problem lies in a fact that for etching conditions mentioned in Japanese Patent Application Laid-open No. 354499/1999, it is difficult to obtain an appropriate etching selection ratio between the silicon oxide film and the polysilicon, if a mixed gas of $CHF_3$ and CO is used. Moreover, because the dust is herein liable to rise and accumulate on the semiconductor substrate to lower the production yield, cleaning of the etching apparatus must be carried out frequently.

In the case that a mixed gas of $C_4F_8$, CO and Ar is used, too, it is difficult to obtain an appropriate etching selection ratio between the silicon oxide film and the polysilicon.

The fifth problem results from the shape of a hole formed by the etching method described in Japanese Patent Application Laid-open No. 354499/1999, that is, in the state when the hole reaches the basic substance, the hole is taper-shaped and its aperture on the side of the basic substance is formed to be narrower. The aperture on the side of the basic substance being narrow, the electrical resistance when being filled up, becomes high so that overetching is normally performed to enlarge the aperture on the side of the basic substance. In this, again, a bowing may be brought about.

Accordingly, the present invention provides, instead of such a method short of stability as the one utilizing etching conditions, a method of making an opening stably in a silicon oxide film to form a minute hole with an aperture of 0.25 μm or less and an aspect ratio exceeding 13 without unduly increasing the number of steps.

SUMMARY OF THE INVENTION

The present inventors ascertained that the following points occur when a minute opening is formed in a silicon oxide film as shown in FIG. 11. That is:

1. The wider the aperture is, the bowing appears in a section corresponding to lower aspect ratios (a shallow section of the opening).
2. With the same aperture, the bowing appears in a section corresponding to higher aspect ratios (a deep section of the opening).

3. Unless the aspect ratio exceeds 12, no bowing appears, regardless of the aperture.

The present invention is suitably applied to the formation of an opening with an aspect ratio of 13 or higher. Further, for a minute opening having an aperture of 0.18 μm or less and an aspect ratio of 13 or higher, the present manufacturing method is particularly well suited, because the bowing is liable to appear even in its section with a depth corresponding to an aspect ratio of 7 or so.

In the present invention, a first etching is stopped at a depth where no bowing occurs to form an opening section. Next, a protective film for etching is formed on a region of the wall surface of the hole in that opening section where a bowing is liable to appear when an opening is formed further.

After that, a second etching is carried out to form an opening further.

The present inventors established that when an opening is formed by the above method, no bowing appears even in a minute opening with an aspect ratio of 13 or higher.

In the case that an opening having an aperture of 0.18 μm or less and an aspect ratio of 13 or higher is formed, it is preferable that the opening formed by the first etching has a depth equivalent to an aspect ratio of 7 to 12 or so. To form an opening with an aspect ratio of 15 or higher, the aspect ratio of the opening by the first etching is preferably 8 or higher.

The first etching may be stopped either at a predetermined time or by an etching stopper layer that is set beforehand.

The protective film for etching may be made of any material whose etching rate in the horizontal direction is lower than the etching rate in the horizontal direction the silicon oxide film has. Further, the etching stopper layer may be made of any material whose etching rate in the direction of the depth is lower than the etching rate in the direction of the depth the silicon oxide film has.

If the above conditions for the protective film for etching and the etching stopper layer can be satisfied by choosing appropriate etching conditions, etching can be carried out by changing etching conditions.

Normally, under the same etching conditions, the etching rates in the horizontal direction and that in the direction of the depth are correlated, depending on the material. The material whose etching rate in the direction of the depth is lower than that of the silicon oxide film has the etching rate in the horizontal direction lower than that of the silicon oxide film has. In general, the etching rate in the direction of the depth is $1/10$ to $1/25$ or so of the etching rate in the horizontal direction.

The protective film for etching formed on the wall surface of the opening must be removed thoroughly, if a cylindrical capacitor is to be formed therein. Meanwhile, in the case of a contact hole or a via hole, it does not matter whether the film remains or not.

In removing the protective film for etching, if the protective film for etching is removed before the opening is further formed by the second etching, a bowing may occur.

After this, the protective film for etching may be removed by performing overetching after formation of the opening by the second etching is completed.

In order to suppress well the occurrence of the bowing in the opening by the second etching, it is preferable that the etching rate of the protective film for etching in the horizontal direction is not greater than $1/10$ of the etching rate of the silicon oxide film in the horizontal direction.

As for the lower limit, there cannot be given any specific value, because it varies with the depth to bore down by the second etching and the thickness of the protective film for etching.

However, in the current state of things, it is more practical to change the thickness of the protective film for etching so as to fit the etching conditions than to change the etching conditions.

The present invention can suppress the occurrence of the bowing by controlling the etching depth. Consequently, in contrast with the conventional techniques, the strict control over the etching conditions is uncalled-for. In the manufacturing method, only the step of etching being added, the number of the steps increases only by one so that the TAT (turn-around-time) in production hardly increases.

Further, with conventional etchings, when a hole just reaches the basic substance, the hole is taper-shaped and the aperture on the side of the basic substance is formed narrow. Because the narrow aperture on the side of the basic substance may eventually cause an increase in electric resistance, the aperture on the side of the basic substance is, in general, enlarged by overetching. On this very occasion, the bowing is liable to occur. In the present invention, even if overetching is carried out, no bowing takes place.

As a result, a factor to cause a short circuit or surpass a prescribed capacitance due to undesigned close proximity of the holes is well removed.

The effects of the present invention in the formation of the cylindrical capacitor are as follows.
(1) As the distance between the holes can be shortened, the device can be advantageously integrated (See FIG. 7(2)).
(2) In the absence of the bowing, no film interruption takes place in the capacitor film formed on the sidewall of the hole (See FIG. 7(1)).
(3) Because a hole with a high aspect ratio can be formed without bringing about the bowing, a cylinder higher than conventional ones can be formed, enabling to obtain a capacitor with a greater capacitance.

For a given capacitance, a cylinder of the present invention affords to have a smaller cross-sectional area so that the degree of integration can be advantageously heightened.

The effects of the present invention in the formation of the contact hole are as follows.
(1) As the distance between the holes can be shortened, the device can be advantageously integrated (See FIG. 7(2)).
(2) In filling up the hole with a conductive film to form a plug electrode, the formation of the void is well suppressed (See FIG. 7(3)).
(3) Because a deep hole etching is possible, the degree of freedom for designing a three-dimensional interconnection increases.

DETAILED DESCRIPTION OF THE INVENTION AND PREFERRED EMBODIMENTS

A method of the present invention in which a minute hole with an aspect ratio of 13 or higher is formed in a silicon oxide film, using a hard mask, while preventing or suppressing a shape defect called the bowing, is described below.

Figure 1:
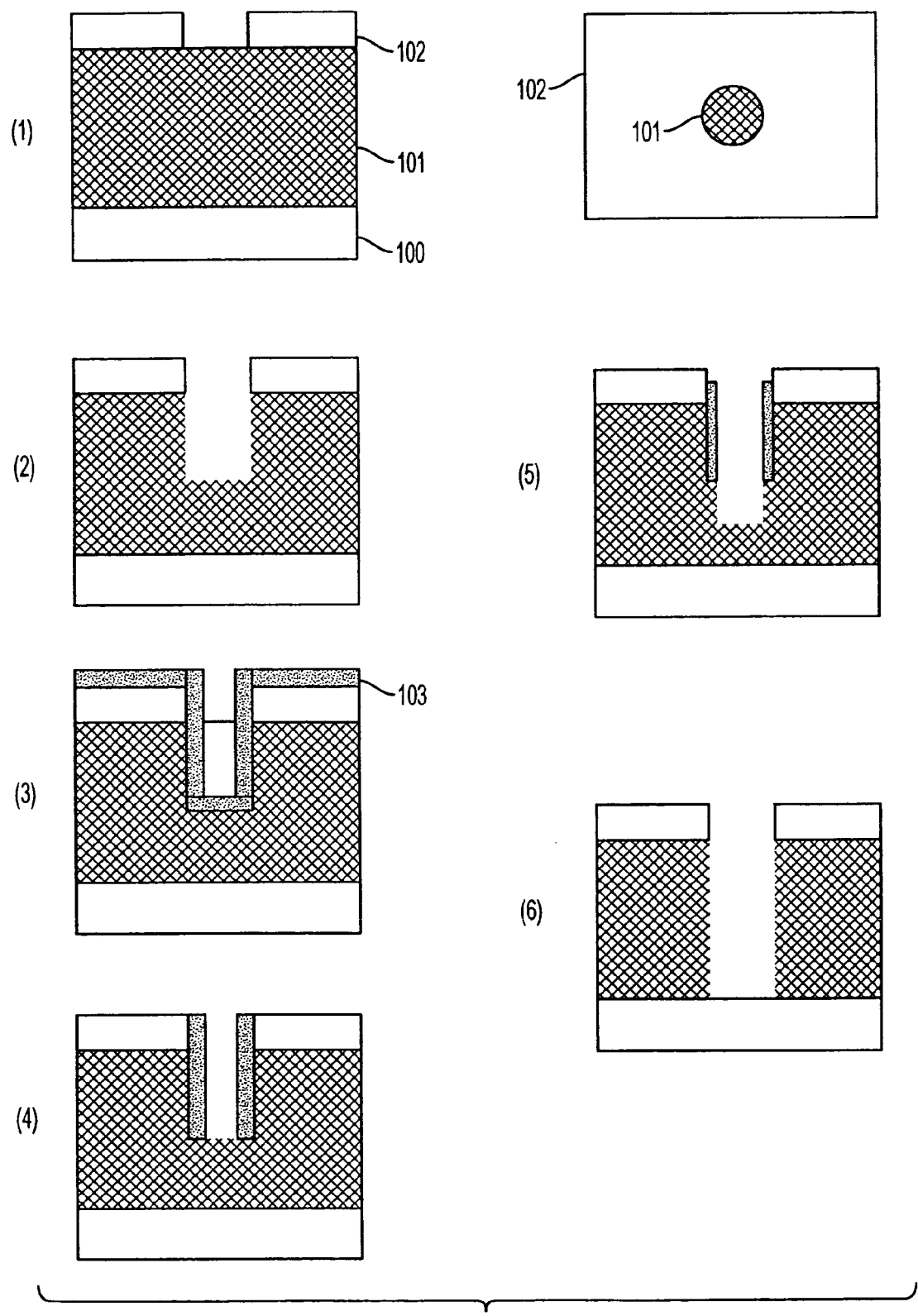
FIG. 1 is a series of cross-sectional views in explaining the steps of a manufacturing method according to the present invention.

FIG. 1 is a series of cross-sectional views as well as a bird's eye view in explaining the steps of First Embodiment.

There is provided a silicon substrate 100 on which a polysilicon film 102 that is to be used as a hard mask for etching is formed, overlying an oxide silicon film 101.

Next, by means of photolithography, an opening is set in a photoresist formed on the polysilicon 102 and, through that opening, the polysilicon 102 is dry etched to form a hard mask for etching. After that, the photoresist is removed (FIG. 1(1))

The polysilicon 102 can be replaced by $Si_3N_4$, SiGe or Ge.

Through the hard mask, a first etching is applied thereto and a hole (an opening section) with an aspect ratio of 7 to 12 where no bowing occurs is formed in the silicon oxide film 101 (FIG. 1(2)). Next, a $Si_3N_4$ film 103 is formed by the low pressure CVD method (FIG. 1(3)). Instead of the $Si_3N_4$ film, a silicon oxynitride film, a polysilicon film, a SiGe film or a Ge film can be used.

Next, the entire surface thereof is dry etched and the $Si_3N_4$ film 103 formed on the polysilicon 102 and on the bottom face of the hole is removed (FIG. 1(4)).

The $Si_3N_4$ film 103 remaining on the sidewall of the hole is required to cover at least in the place of the hole corresponding to the aspect ratios of 2 to 7 where the bowing is liable to occur. After that, by applying a second etching thereto, the $Si_3N_4$ film 103 remaining on the lateral face of the hole is removed, while the silicon oxide film 101 is dry etched (FIG. 1(5)), and an opening to reach the silicon substrate 100 is formed (FIG. 1(6)).

FIG. 1(5) herein is a view depicting a state in which the $Si_3N_4$ film 103 is etched simultaneously with the silicon oxide film 101 by the second etching.

In the present embodiment, by the entire surface etching (in the case that the entire surface etching and the second etching have the same etching conditions, the initial state of the second etching), the $Si_3N_4$ film 103 is etched back and a sidewall of the $Si_3N_4$ film is formed on the surface of the hole wall. The side wall $Si_3N_4$ film is simultaneously removed when the silicon oxide film is etched still deeper by the second etching. If the sidewall $Si_3N_4$ film is completely etched away before formation of the hole to reach the silicon substrate 100 is completed, a bowing may occur so that the thickness of the $Si_3N_4$ film must be set appropriately so as not to allow such a thing happening.

Apart from the film thickness of the $Si_3N_4$ film, the condition of the etching selection ratio between the $Si_3N_4$ film and the silicon oxide film can be met, needless to say, by a set of two different conditions, etching conditions for the entire surface etching of the $Si_3N_4$ film and etching conditions for the etching of the silicon oxide film.

In the present embodiment, since, even if a hole to reach the silicon substrate is formed and its aspect ratio exceeds the aspect ratio of 13 with which a bowing is liable to occur, the very place of the hole wall surface where the bowing is liable to occur is covered with the $Si_3N_4$ film whose etching selection ratio is lower than that of the oxide film, the hole wall surface cannot be subjected to the aberrant etching till the $Si_3N_4$ film is removed and no bowing develops.

Although the silicon oxide film 101 in FIG. 1 is formed immediately above the silicon substrate 100, it goes without saying that a semiconductor element, an interconnection, an insulating film or the like formed on a silicon substrate 100 can be laid under the silicon oxide film 101.

To suppress the bowing from developing in the opening by the second etching, the etching rate in the horizontal direction for the $Si_3N_4$ film is preferably equal to or less than 1/10 of the etching rate in the horizontal direction for the silicon oxide film.

Figure 2:
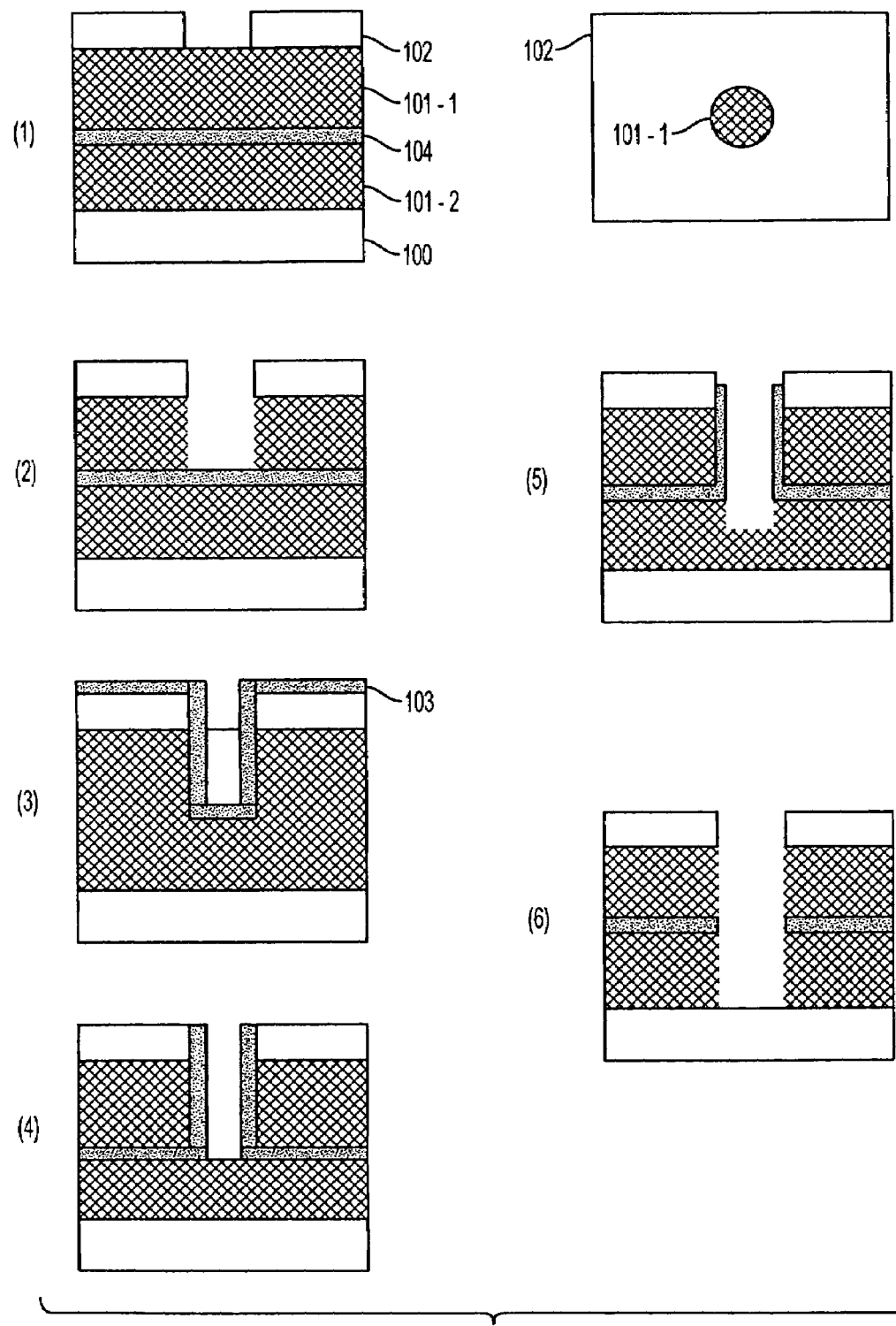
FIG. 2 is a series of cross-sectional views in explaining the steps of a manufacturing method according to the present invention.
Figure 3A:
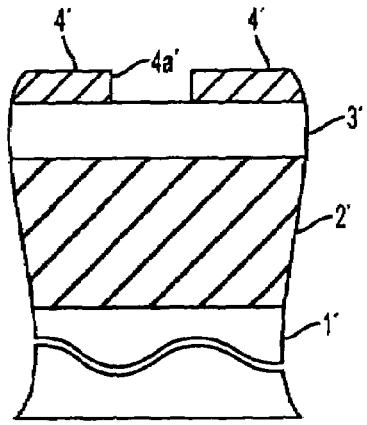
FIG. 3 is a series of cross-sectional views illustrating the steps of a conventional manufacturing method.
Figure 3D:
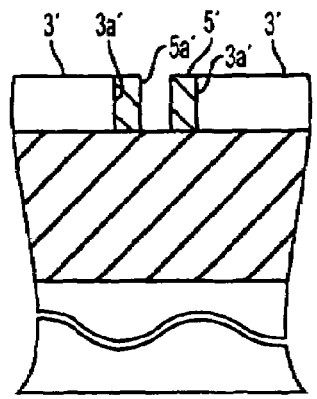
Figure 3B:
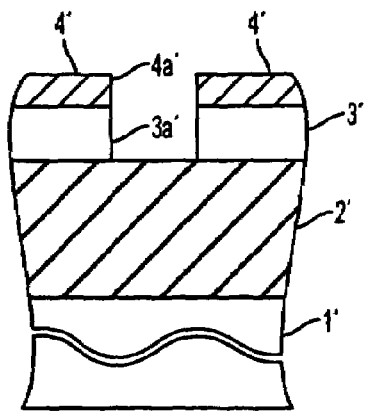
Figure 3E:
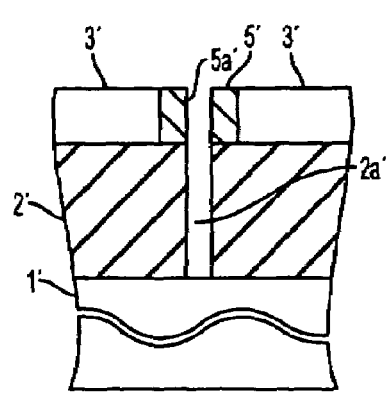
Figure 3C:
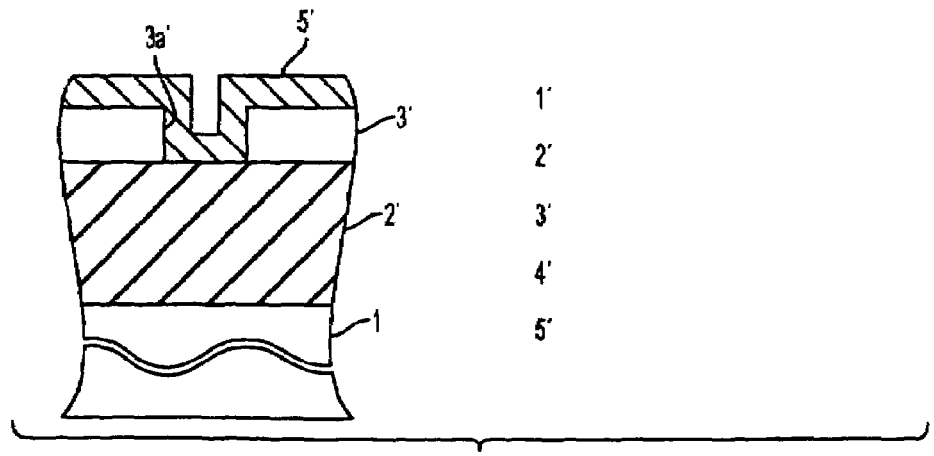
Figure 4:
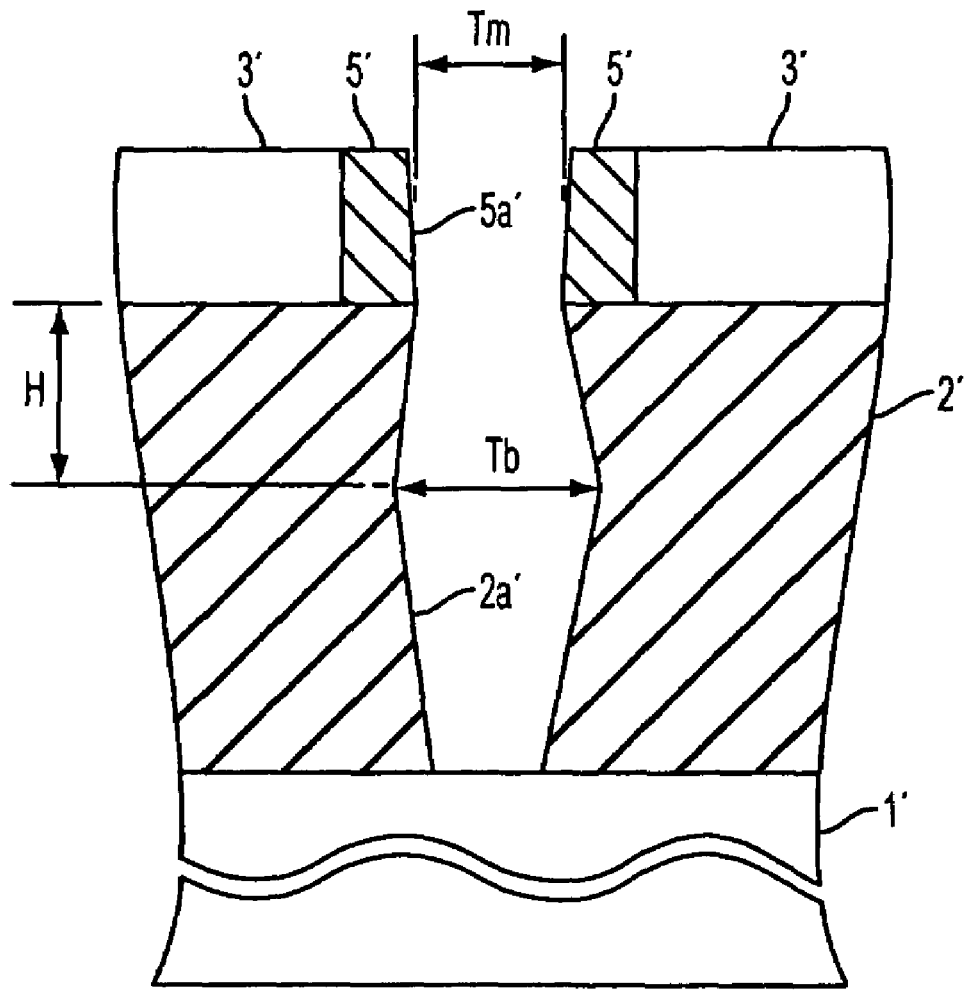
FIG. 4 is a cross-sectional view in explaining the bowing.

A modified embodiment of First Embodiment is shown in FIG. 2.

In FIG. 2, there is formed a $Si_3N_4$ film 104, which is to function as an etching stopper, between a first silicon oxide film 101-1 and a second silicon oxide film 101-2. The etching stopper may also be made of polysilicon, SiGe, or Ge.

The silicon oxide films 101-1 and 101-2 can be made of silicon oxide being formed by the CVD method, non-doped silicate glass, silicate glass containing at least either of boron and phosphorus or silicon oxide which is formed by sintering a coating of siloxane applied thereto by the spin-on-glass method.

As shown in FIG. 1(1), a polysilicon film 102 is set to be used as a hard mask for dry etching (FIG. 2(1)) and an oxide film 101-2 being dry etched by a first dry etching, a hole is formed so as to reach a $Si_3N_4$ film 104 (FIG. 2(2)). Next, a $Si_3N_4$ film 103 is formed by the low pressure CVD method (FIG. 2(3)).

Next, the entire surface thereof is dry etched and the $Si_3N_4$ film 103 formed on the polysilicon 102 and on the bottom face of the hole as well as the $Si_3N_4$ film 104 lying on the bottom face of the hole, which acts as an etching stopper, are removed (FIG. 2(4)). After that, by applying a second etching thereto, the $Si_3N_4$ film 103 remaining on the wall surface of the hole is removed, while the silicon oxide film 101-1 is dry etched (FIG. 2(5)) and an opening to reach the silicon substrate 100 is formed (FIG. 2(6)).

Needless to say, the entire surface dry etching and the second dry etching can be performed continuously under the same conditions.

In the present embodiment, at the time of the first etching, because etching is stopped at the etching stopper layer, overetching does not happen. Accordingly, it is possible to provide some extra time in the step of bringing the etching to a halt. Further, anisotropic etching normally forms the diameter at the hole bottom narrower than that at the top of the hole. When an etching stopper layer is set, etching in the direction of the depth is stopped once and thereafter etching in the horizontal direction starts at the hole bottom, and, therefore, the cross-section of the hole can take the form of more regular rectangle.

In the present embodiment, in the second half of the hole etching of the silicon oxide film when a bowing is liable to occur, a sidewall $Si_3N_4$ film is provided for the upper section of the hole which is the very place that the bowing is liable to appear so that the bowing can be prevented or suppressed from occurring. The sidewall $Si_3N_4$ film formed on the sidewall of the hole may be removed while the silicon oxide film 101-1 is etched in the second half of the second hole etching.

In the above description of the present embodiment, the $Si_3N_4$ film formed on the sidewall of the hole is completely removed when the formation of the hole is accomplished. However, in the case of a via hole for connecting an upper layer interconnection with a lower layer interconnection, the $Si_3N_4$ film can be left on the wall surface of the hole.

If the situation allows the $Si_3N_4$ film to remain on the wall surface of the hole, the $Si_3N_4$ film 103 can be formed to have a substantial thickness.

The material of the sidewall formed on the wall surface of the hole can be, apart from the $Si_3N_4$ film, any material whose etching rate is lower than the etching rate of the material that is to be used to fill up the hole, and must be appropriately chosen, depending on the hole filling material.

In the case that the hole filling material is a silicon oxide film, a silicon oxynitride film, a polysilicon film, a SiGe film, a Ge film or the like can be used as the sidewall material, apart from a $Si_3N_4$ film.

EXAMPLE 1

As First Example of the present invention, a manufacturing method of a cylindrical capacitor of a DRAM is described below, referring to FIG. 5.

On a silicon substrate 100, a $Si_3N_4$ film 105 that is to be used as a bottom film of a cylindrical capacitor when formed is grown by the low pressure CVD method and thereon a silicon oxide film 101 that is to be used as a capacitor film of the cylindrical capacitor is formed to a thickness of 2 μm by the low pressure CVD method.

An underlying layer of the $Si_3N_4$ film 105 that is to function as a bottom film of the cylindrical capacitor varies with the structure of the DRAM but, herein, it is omitted because it is not particularly related to the present example.

The thickness of the silicon oxide film or the depth of the hole into which a cylindrical capacitor is to be formed is the parameter of the utmost importance to determine the amount of the capacitance of the cylindrical capacitor. Viewed in the light of device characteristics, a large capacitance is normally preferable so that the film thickness is set to be as thick as possible within the range of the workable thickness and, thus, not limited to 2 μm.

As a hard mask, a polysilicon film 102 with a thickness of 100 nm to 150 nm is grown immediately above the silicon oxide film 101. This film functions as a mask when dry etching is applied to the silicon oxide film, and may be a film made of a material with an etching rate lower than that of the silicon oxide film. Apart from polysilicon, doped polysilicon, $Si_3N_4$, SiGe, Ge or such can be employed therefor.

These silicon oxide films and polysilicon films can be formed also by the plasma CVD method.

Next, patterning (exposure, development and such) is carried out by a known technique of lithography. When the minimum diameter of the hole pattern is 0.15 μm, the aspect ratio becomes 13.3 (2 μm/0.15 m=13.3).

Next, using a photoresist as a mask, dry etching for formation of a polysilicon hard mask is performed. After dry etching, remaining photoresists, etching deposition residuals and the likes are removed with a SPM (a mixed solution of sulfuric acid and hydrogen peroxide), an APM (a mixed solution of ammonia and hydrogen peroxide), a diluted hydrofluoric acid solution or the like.

These dry etching conditions for the polysilicon are ordinary ones and an anisotropic etching treatment may be made with a chlorine-based mixed gas, a mixed gas containing HBr or the like.

Figure 6:
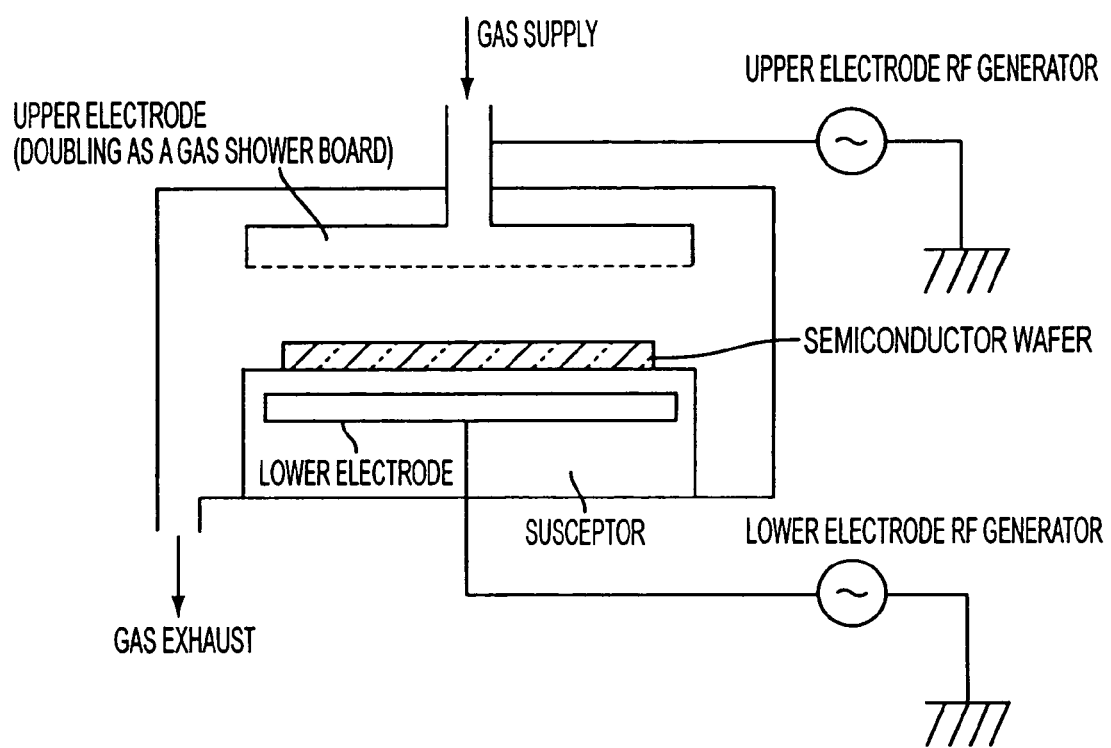
FIG. 6 is a schematic diagram showing a two-frequency type RIE dry etching apparatus.
Figure 7:
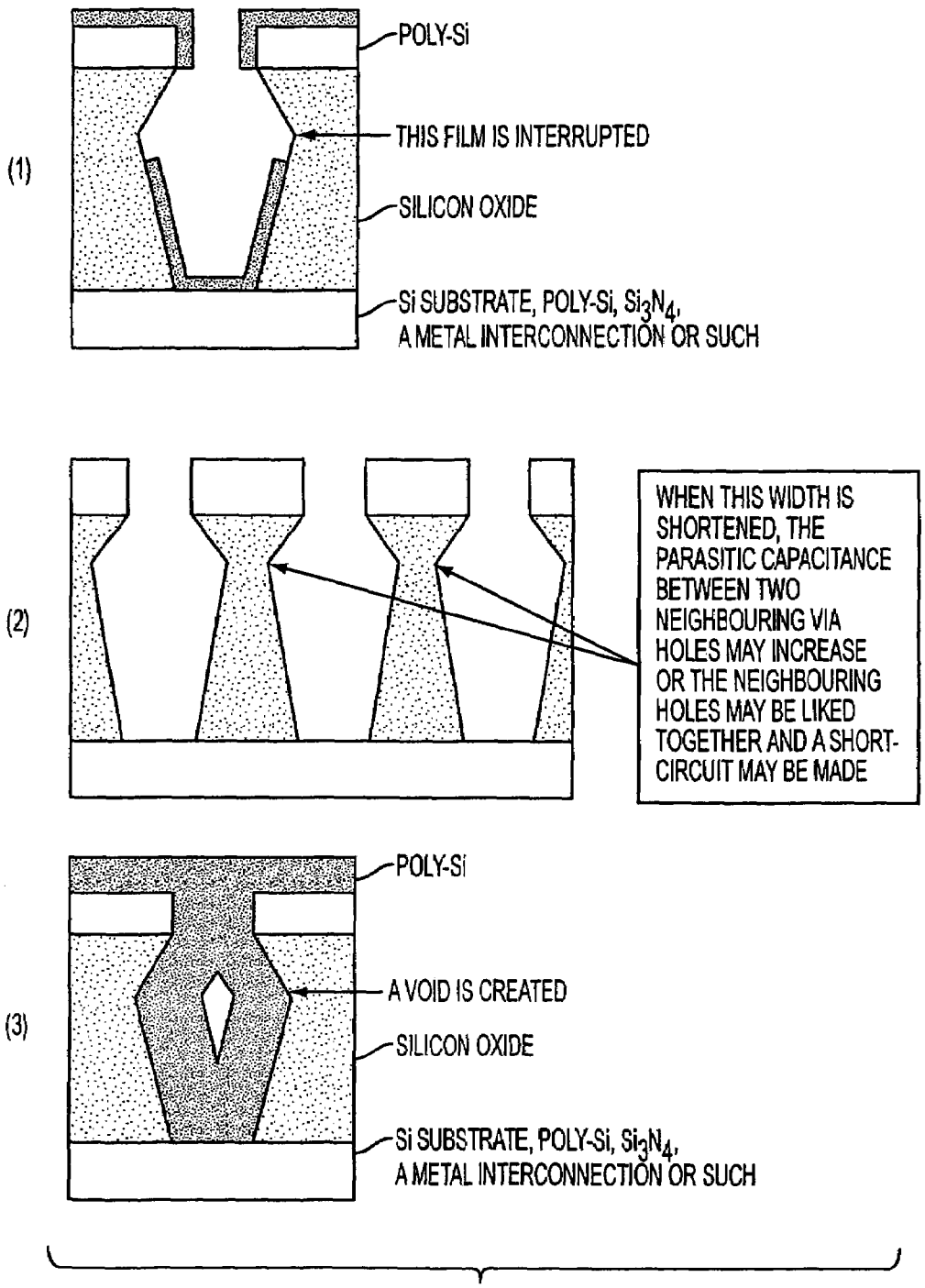
FIG. 7 is a set of schematic views in explaining defects caused by the bowing.

Next, a treatment is made using a two-frequency type RIE (Reactive Ion Etching) apparatus shown in FIG. 6. The apparatus is characterized by the presence of two types of RF (Radio Frequency) generators, providing an upper band of RF frequencies between 13.56 MHz and 100 MHz and a lower band of RF frequencies between 400 KHz and 2 MHz, and, in recent years, has been used widely by the present inventors.

Firstly, a first etching of the silicon oxide film is performed. The details of the conditions are as follows.

Wafer susceptor temperature: 40° C. to 60° C.
$C_4F_8$ (Fluorocarbon gas such as $C_5F_8$, $C_4F_6$ can be also used): 20 sccm to 40 sccm (standard cubic centimeters minute)
Ar: 500 sccm to 800 sccm
$O_2$: 20 sccm to 40 sccm
Upper RF: 1000 W to 2000 W
Lower RF: 1000 W to 2000 W Under these conditions, the etching rate ratio in the direction of the depth, that is, the etching rate of the oxide film/the etching rate of the $Si_3N_4$ film is approximately 10, while the etching rate ratio in the horizontal direction is approximately 20.

Figure 5:
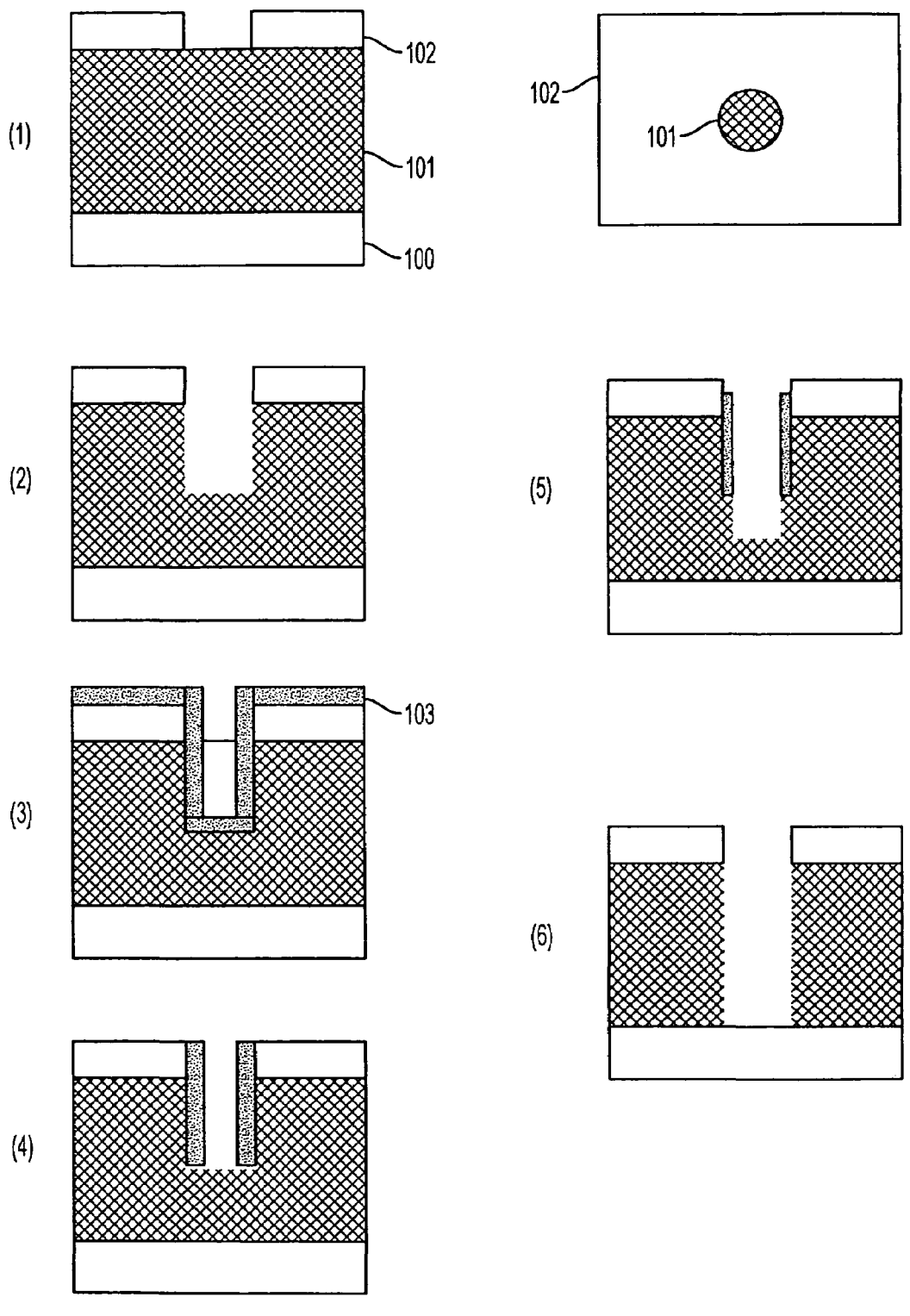
FIG. 5 is a series of cross-sectional views in explaining the steps of a manufacturing method according to the present invention.

After the first etching of the silicon oxide film, a state shown in FIG. 5(2) is obtained. The depth possible to be etched while keeping a bowingless state corresponds to an aspect ratio of 7 to 12. In other words, in the present example with an aperture of 0.15 μm, down to a depth of 1.05 μm to 1.8 μm a bowing does not occur. Accordingly, the depth for the first etching of the silicon oxide film may be set to be 1.05 μm to 1.8 μm. Meanwhile, in a hole with an aspect ratio of 12 or greater, the place where a bowing occurs has a depth equivalent to aspect ratios of 2 to 7, and when an aperture of the hole is 0.15 μm, this corresponds to a region at depths of 300 nm to 1.05 μm. It is this place a bowing is liable to occur that a sidewall which is to be set in the next step is required to be formed. In effect, when the depth of the first etching is set to be 1.05 μm to 1.8 μm, the sidewall $Si_3N_4$ film which is to be formed in the next step can be optimally set in the very place where a bowing is liable to occur when the second etching is made.

In the present example, the etching was carried our for the time period calculated from the etching rate so as to reach the depth of 1.5 μm or so.

Under the first etching conditions, fluorocarbon gas is employed. The dry etching with fluorocarbon gas is liable to leave fluorocarbon-based deposition residuals on the wafer surface. It is therefore preferable to remove, after the etching, reaction products using the plasma peeling-off method or a solution such as a diluted hydrofluoric acid solution, an APM or a SPM.

Next, a $Si_3N_4$ film with a thickness of 4 nm is formed by the low pressure CVD method so as to have a uniform thickness (FIG. 5(3)). For this, it is also possible to use any other method than the low pressure CVD method as long as a film of dense quality (excelling in etching resistance) with a capability to provide good coverage (a high conformability) can be obtained.

In the present example, a $Si_3N_4$ film with a thickness of 4 nm was formed. This can be explained from a fact that, in removing the silicon oxide by the second etching, if the $Si_3N_4$ film formed on the wall surface of the hole is removed prior to the completion of the hole, there occurs a bowing. The actual thickness of the $Si_3N_4$ film is determined, depending on the conditions of the second etching, but a film thickness of 2 nm to 5 nm is, in general, suitable.

At the time the opening just reaches the silicon substrate 100, the opening is taper-shaped. The aperture of the opening on the side of the substrate is narrow and the contact resistance, when filled up, becomes high. Overetching is preferably performed until the aperture of the opening on the side of the substrate becomes the same as that of the top. The film thickness is, therefore, preferably set, taking overetching into consideration. The film thickness of 4 nm set in the present example is the one obtained under the condition that overetching is performed for approximately 20 seconds after the hole reaches the silicon substrate 100. The overetching condition differs in etching conditions as well as the etching apparatus and it is apparent that an actual value must be set appropriately, independent of the value obtained in the present example.

Next, applying dry etching to the entire surface thereof, portions of the $Si_3N_4$ film 103 formed on the surface of the polysilicon that is to be used as a hard mask as well as on the bottom of the hole are removed (FIG. 5(4)). After that, second dry etching is performed consecutively to remove the silicon oxide 101 and form a hole down to reach the $Si_3N_4$ film 105 that is to become a bottom film of a cylindrical capacitor (FIG. 5(5)). In the present example, the opening which is not taper-shaped but rectangular was successfully formed.

In the present example, for the entire surface dry etching and the second etching, the same conditions as for the first etching are employed.

In this way, formation of a hole for a bowingless cylindrical capacitor with a high aspect ratio can be accomplished.

EXAMPLE 2

Figure 9:
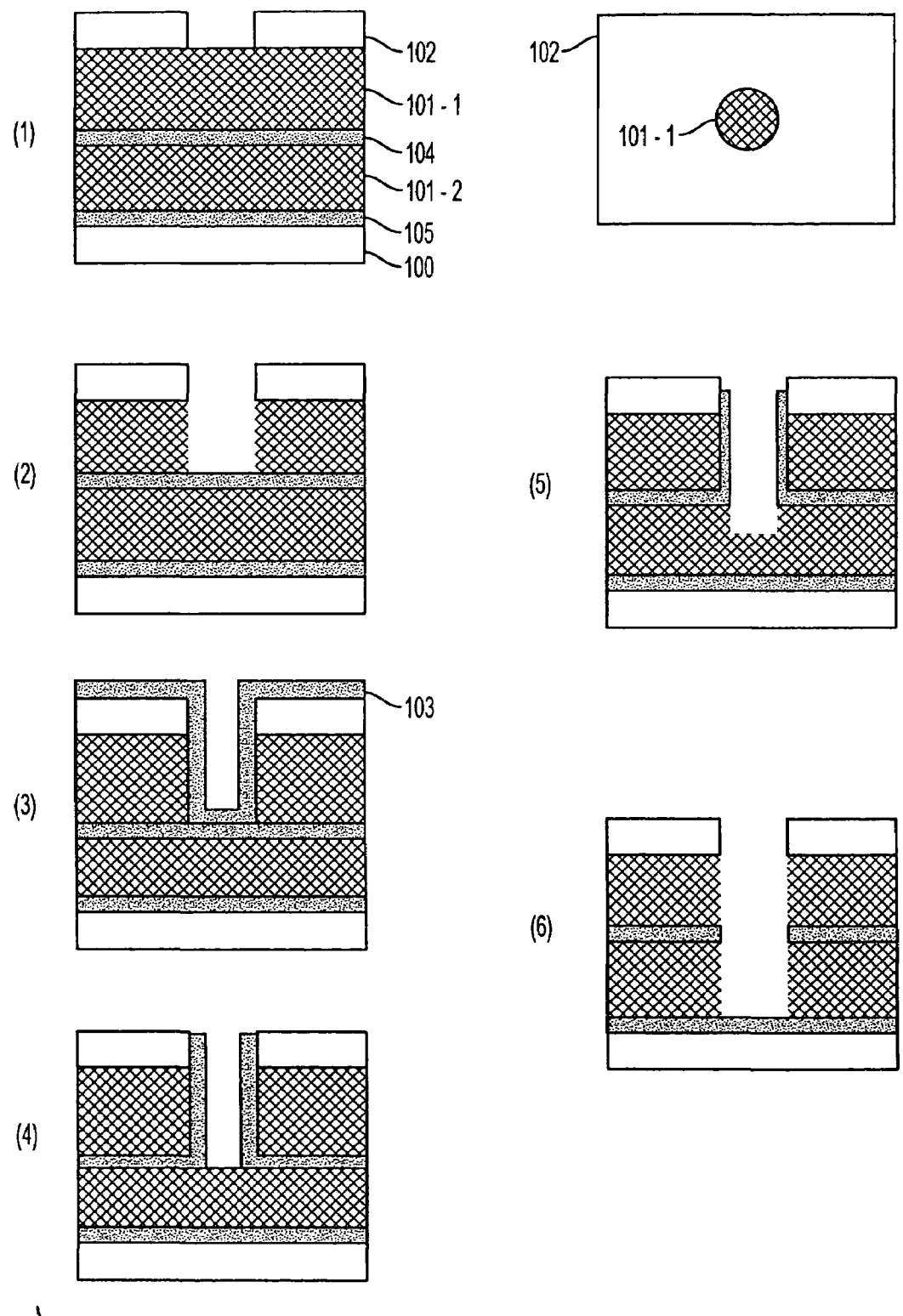
FIG. 9 is a series of cross-sectional views in explaining the steps of a manufacturing method according to the present invention.

Referring to FIG. 9, Second Example, which is a modified example of First Example, is described below.

In FIG. 9, differing from in FIG. 5, a $Si_3N_4$ film 104, which is to function as an etching stopper, is formed in a layer 101 of silicon oxide through which a hole for a cylindrical capacitor is formed.

On a silicon substrate 100, a $Si_3N_4$ film 105 that is to be used as a bottom film of a cylindrical capacitor when formed is grown by the low pressure CVD method and thereon a lower layer of silicon oxide 101-1 with a thickness of 0.5 μm, a $Si_3N_4$ layer 104 with a thickness of 15 nm which is to function as an etching stopper, an upper layer of silicon oxide 101-2 with a thickness of 1.5 μm and a polysilicon film 102 with a thickness of 100 nm which is to be used as a hard mask are formed, in this order, by the low pressure CVD method or the plasma CVD method.

An underlying layer of the $Si_3N_4$ film 105 that is to function as a bottom film of the cylindrical capacitor varies with the structure of the DRAM but, herein, it is omitted because it is not particularly related to the present example.

The thickness of the silicon oxide film or the depth of the hole into which a cylindrical capacitor is to be formed is the parameter of the utmost importance to determine the amount of the capacitance of the cylindrical capacitor. Viewed in the light of device characteristics, a large capacitance is normally preferable so that the film thickness is set to be as thick as possible within the range of the workable thickness, and although the combined thicknesses of the upper layer of silicon oxide and the lower layer of silicon oxide herein is 2 μm, they are not necessarily limited to this thickness.

The polysilicon film 102 with a thickness of 100 nm, which is to be used as a hard mask, functions as a mask when dry etching is applied to the silicon oxide film. For this, a film made of a material with an etching rate lower than that of the silicon oxide film is chosen, and, apart from polysilicon, doped polysilicon, $Si_3N_4$, SiGe, Ge or such can be employed therefor.

Next, patterning (exposure, development and such) is carried out by a known technique of lithography. When the minimum diameter of the hole pattern is 0.15 μm, the aspect ratio becomes 13.3 (2 μm/0.15 μm=13.3).

Next, using a photoresist as a mask, dry etching for formation of a polysilicon hard mask is performed. After dry etching, remaining photoresists, etching deposition residuals and the likes are removed with a SPM (Sulfuric Peroxide Mix) (a mixed solution of sulfuric acid and hydrogen peroxide), an APM (Ammonia Peroxide Mix) (a mixed solution of ammonia and hydrogen peroxide), a diluted hydrofluoric acid solution or the like.

These dry etching conditions for the polysilicon are ordinary ones and an anisotropic etching treatment may be made with a chlorine-based mixed gas, a mixed gas containing HBr or the like.

Next, a treatment is made using a two-frequency type RIE (Reactive Ion Etching) apparatus shown in FIG. 6. The apparatus is characterized by the presence of two types of RF (Radio Frequency) generators, providing an upper band of RF frequencies between 13.56 MHz and 100 MHz and a lower band of RF frequencies between 400 KHz and 2 MHz, and, in recent years, has been used widely by the present inventors.

Firstly, a first etching of the silicon oxide film is performed. The details of the conditions are as follows.

Wafer susceptor temperature: 40° C. to 60° C.
$C_4F_8$ (Fluorocarbon gas such as $C_5F_8$, $C_4F_6$ can be also used): 20 sccm to 40 sccm
Ar: 500 sccm to 800 sccm
$O_2$: 20 sccm to 40 sccm
Upper RF: 1000 W to 2000 W
Lower RF: 1000 W to 2000 W After the first etching of the silicon oxide film, a state shown in FIG. 9(2) is obtained. The depth possible to be etched while keeping a bowingless state corresponds to an aspect ratio of 7 to 12. In other words, in the present example with an aperture of 0.15 μm, down to a depth of 1.05 μm to 1.8 μm a bowing does not occur. Accordingly, the film thickness of the upper layer of silicon oxide 101-2 may be set to be 1.5 μm and, immediately under the upper layer of silicon oxide 101-2, a $Si_3N_4$ film 104 which is to act as an etching stopper may be formed.

Meanwhile, in a hole with an aspect ratio of 12 or greater, the place where a bowing occurs has a depth equivalent to aspect ratios of 2 to 7. When an aperture of the hole is 0.15 μm, this corresponds to a region at depths of 300 nm to 1.05 μm, and it is this place a bowing is liable to occur that a sidewall which is to be set in the next step is required to be formed. In effect, when the depth of the first etching is set to be 1.05 μm to 1.8 μm, the sidewall $Si_3N_4$ film which is to be formed in the next step can be optimally set in the very place where a bowing is liable to occur when the second etching is made.

In the present example, the etching stopper is formed at a depth of 1.5 µm.

In the present example, because the $Si_3N_4$ film 104 is formed to function as an etching stopper, even if extra first etching time period is provided, the etching does not proceed deeper than designed. It is, therefore, possible to give some extra time to the first etching time period. Further, this etching stopper has the effect of preventing excessive etching to take place even if the etching rate increases due to a change in etching conditions.

Under the first etching conditions, fluorocarbon gas is employed. The dry etching with fluorocarbon gas is liable to leave fluorocarbon-based deposition residuals on the wafer surface. It is therefore preferable to remove, after the etching, reaction products using the plasma peeling-off method or a solution such as a diluted hydrofluoric acid solution, an APM or a SPM.

Next, a $Si_3N_4$ film with a thickness of 10 nm is formed by the low pressure CVD method so as to have a uniform thickness (FIG. 9(3)). The thickness of the $Si_3N_4$ film is optimally 5 nm to 15 nm. Further, it is also possible to use any other method than the low pressure CVD method as long as a film of dense quality (excelling in etching resistance) with a capability to provide good coverage (a high conformability) can be obtained.

In the present example, a $Si_3N_4$ film with a thickness of 2 nm to 5 nm was formed. This can be explained from a fact that, in removing the silicon oxide by the second etching, if the $Si_3N_4$ film formed on the wall surface of the hole is removed prior to the completion of the hole, there occurs a bowing. The actual thickness of the $Si_3N_4$ film is determined, depending on the conditions of the second etching.

Next, applying dry etching to the entire surface thereof, portions of the $Si_3N_4$ film 103 formed on the surface of the polysilicon that is to be used as a hard mask as well as on the bottom of the hole are removed (FIG. 9(4)). After that, second dry etching is consecutively applied thereto through the polysilicon hard mask to remove the silicon oxide 101 and form a hole down to reach the $Si_3N_4$ film 105 that is to become a bottom film of a cylindrical capacitor (FIG. 9(5)). In the present example, too, overetching was performed for approximately 20 seconds after the opening reached the silicon substrate 100, and thereby modification of the taper-like shape was made.

In the present example, for the entire surface dry etching and the second etching, the same conditions as for the first etching are employed.

In this way, formation of a hole for a bowingless cylindrical capacitor with a high aspect ratio can be accomplished.

EXAMPLE 3

Figure 8:
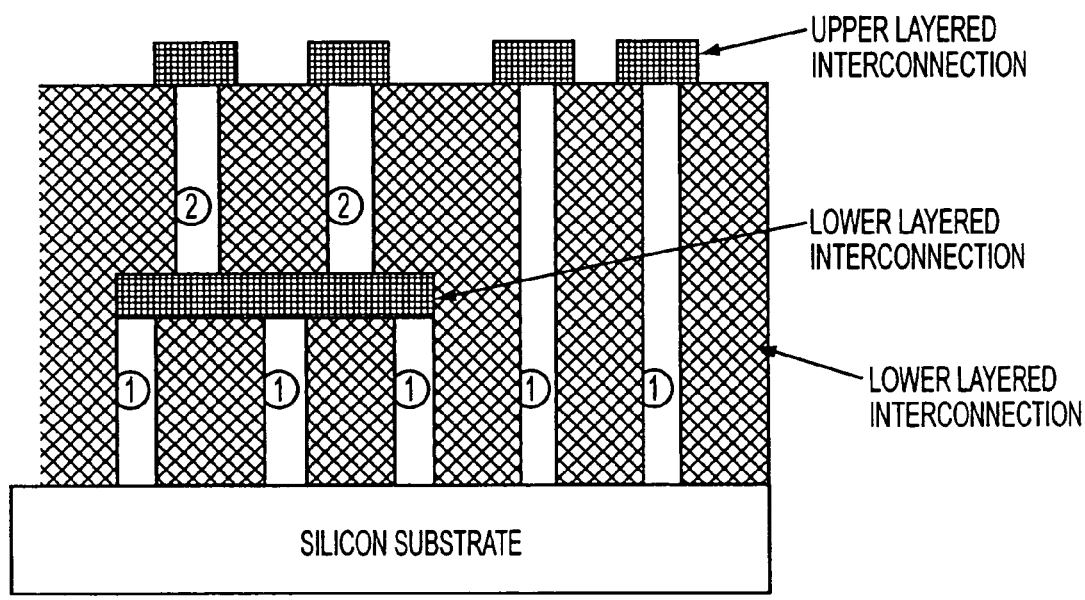
FIG. 8 is a schematic cross-sectional view showing the structure of contact holes and via holes.

As Third Example of the present invention, a manufacturing method of a contact hole (a hole interconnection running in the vertical direction and connecting an interconnection with a Si substrate) or a via hole (a hole interconnection running in the vertical direction and connecting an upper layer interconnection layer with a lower layer interconnection layer) shown in FIG. 8 is described below.

In recent years, the semiconductor integrated circuit device has become large in scale, and the multi-layered interconnection with three layers or more is commonly in use. In FIG. 8, there is shown an example of a double-layered interconnection, comprising a semiconductor element or an interconnection formed on a silicon substrate and interconnections formed on two layer levels. In this case, when the interconnection on the second layer level is connected with the interconnection lying on the substrate, an aspect ratio of a hole exceeds 13 and a bowing may occur therein. Because the spacing of the neighbouring interconnections is narrow, when the bowing occurs, the interconnections in neighbouring contact holes may make a short circuit. Further, even if no short-circuit is made, the distance between the neighbouring contact holes become shorter than designed so that the parasitic capacitance increases and the device characteristics deteriorate.

Now, referring to FIG. 10, the present example is described below.

Figure 10:
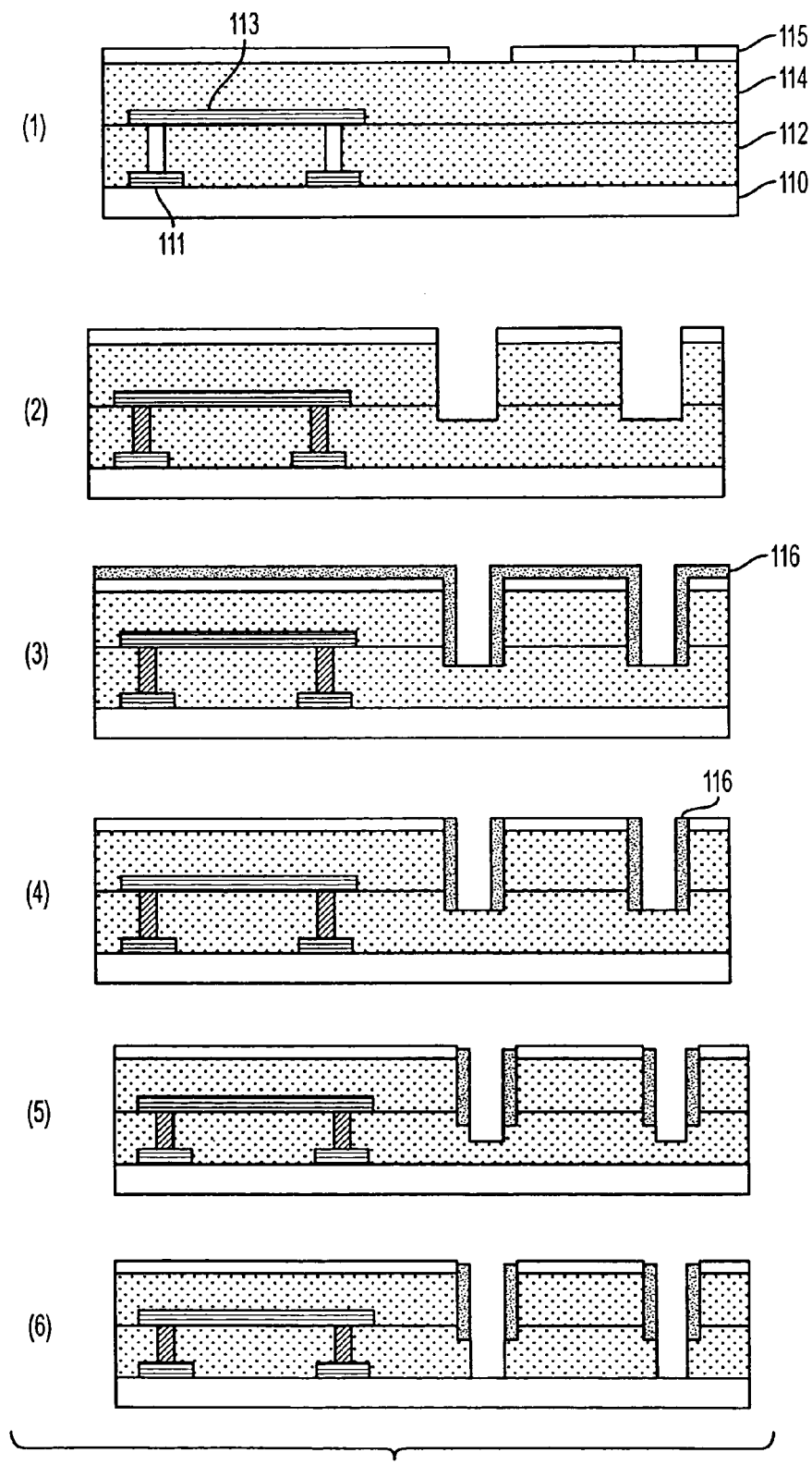
FIG. 10 is a series of cross-sectional views in explaining the steps of a manufacturing method according to the present invention.
Figure 11:
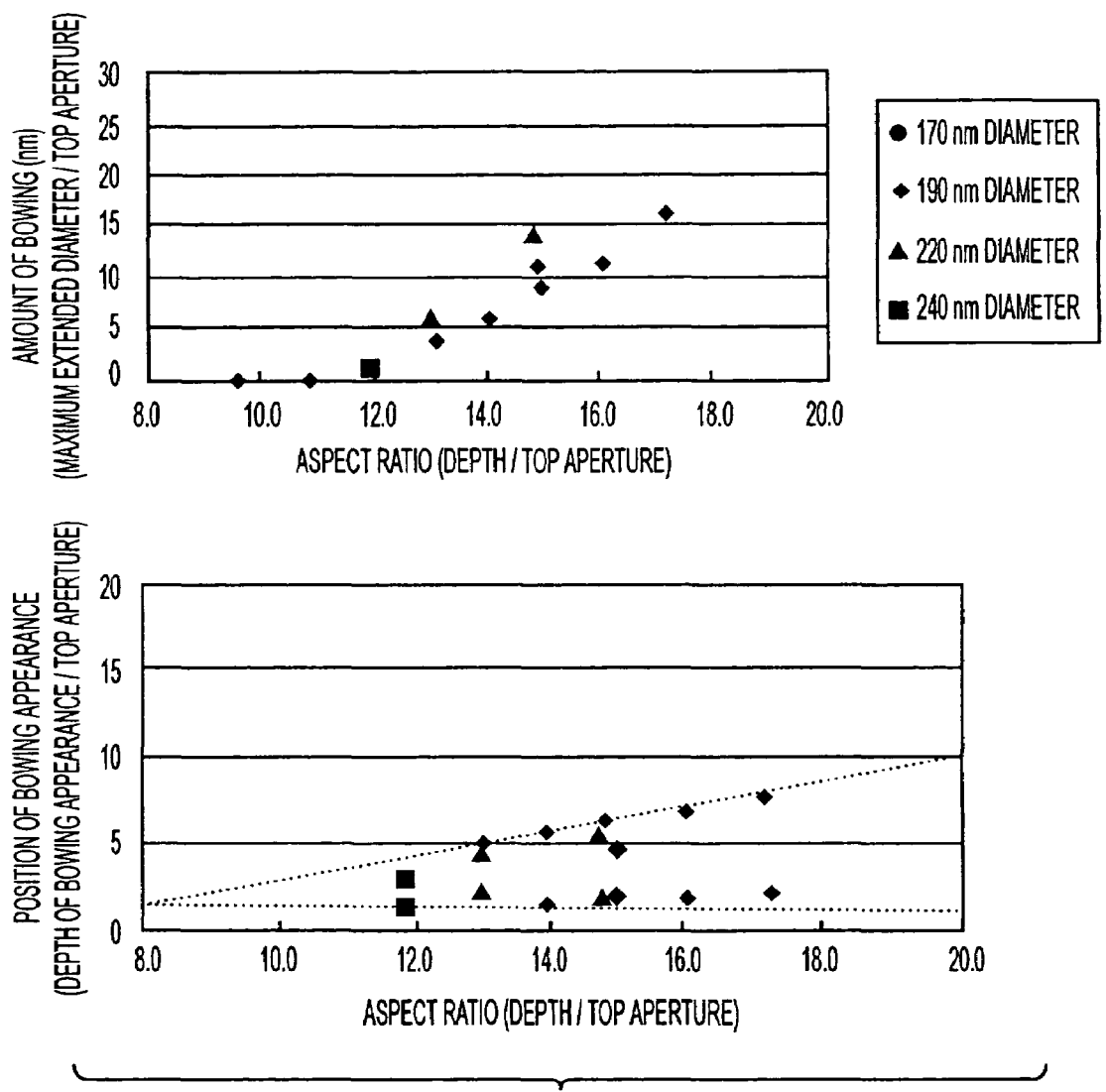
FIG. 11 is a pair of graphical representations showing the relationship between the hole depth and the occurrence of the bowing.

While a manufacturing method of a via hole to connect an interconnection on the first layer level with an interconnection on the third layer level (not shown in the drawings) is shown in FIG. 10, it is apparent that the method is not limited to the case shown therein.

There are comprised a first interconnection 111 and a second interlayer insulating film 112 formed on a first interlayer insulating film 110; a second interconnection 113 formed on the second interlayer insulating film 112; a third interlayer insulating film 114 formed on the second interconnection 113; and a polysilicon film 115 formed on the third interlayer insulating film 114, which is to be used as a hard mask for etching.

The first interlayer insulating film 110, the second interlayer insulating film 112 and the third interlayer insulating film 114 are each a silicon oxide film with a thickness of 1.5 µm. The first interconnection 111 and the second interconnection 113 are each an interconnection of polysilicon doped with dopants. The interconnections can be also made of TiN, W, AlCu, Ti, CoSi, TiSi or such. The polysilicon film 115 that is to be used as a hard mask for etching is an insulating film with a thickness of 100 nm to 150 nm into which no dopants are doped. The silicon oxide films and the polysilicon films are formed by the low pressure CVD method or the plasma CVD method.

A hard mask for etching made of polysilicon is used as a mask in etching the silicon oxide films, and, therefore, without being limited to polysilicon, can utilize any material having a high etching selection ratio to the silicon oxide film. Examples for the material include, apart from polysilicon, a silicon nitride film ($Si_3N_4$ film), a silicon oxynitride film, a SiGe film and a Ge film.

Next, patterning (exposure, development and such) is carried out by a known technique of lithography. A hole pattern with a diameter of 0.2 µm is formed (FIG. 10(11)).

Next, using a photoresist as a mask, etching for formation of a polysilicon hard mask is performed. After etching, remaining photoresists, etching deposition residuals and the likes are removed with a SPM or such.

The dry etching conditions for the polysilicon are ordinary ones and a treatment may be made under the conditions of a chlorine-based mixed gas, a mixed gas containing HBr or the like.

Next, a treatment is made using a two-frequency type RIE (Reactive Ion Etching) apparatus shown in FIG. 6. The apparatus is characterized by the presence of two types of RF (Radio Frequency) generators, providing an upper band of RF frequencies between 13.56 MHz and 100 MHz and a lower band of RF frequencies between 400 KHz and 2 MHz, and, in recent years, has been used widely by the present inventors.

A first etching of the silicon oxide film is then performed. The details of the conditions are as follows.

Wafer susceptor temperature: 40° C. to 60° C.
$C_4F_8$ (Fluorocarbon gas such as $C_5F_8$, $C_4F_6$ can be also used): 20 sccm to 40 sccm
Ar: 500 sccm to 800 sccm
$O_2$: 20 sccm to 40 sccm
Upper RF: 1000 W to 2000 W
Lower RF: 1000 W to 2000 W After the first etching of the silicon oxide film, a state shown in FIG. 10(2) is obtained.

The depth possible to be etched while keeping a bowingless state corresponds to an aspect ratio of 7 to 12. In other words, in the present example with an aperture of 0.2 µm, down to a depth of 1.4 µm to 2.4 µm a bowing does not occur. Accordingly, the depth for the first etching of the silicon oxide film may be set to be 1.4 µm to 2.4 µm.

In the present example, a hole with a depth of 2.0 µm was formed by the first silicon oxide etching.

Under the first etching conditions, fluorocarbon gas is employed. The dry etching with fluorocarbon gas is liable to leave fluorocarbon-based deposition residuals on the wafer surface. It is therefore preferable to remove, after the etching, reaction products using the plasma peeling-off method or a solution such as a diluted hydrofluoric acid solution, an APM or a SPM.

Next, a $Si_3N_4$ film 116 with a thickness of 20 nm is formed by the low pressure CVD method so as to have a uniform thickness (FIG. 10(3)). For this, it is also possible to use any other method than the low pressure CVD method as long as a film of dense quality (excelling in etching resistance) with a capability to provide good coverage (a high conformability) can be obtained.

Next, the entire surface etching is applied onto the $Si_3N_4$ film under the following conditions and portions of the $Si_3N_4$ film 103 lying on the surface of the polysilicon film 115 as well as on the bottom of the hole are removed (FIG. 10(4)).

Wafer susceptor temperature: 40° C. to 60° C.
$C_4F_8$ (or $CHF_3$): 30 sccm to 100 sccm
Ar: 200 sccm
$O_2$: 15 sccm to 50 sccm
Upper RF: 1000 W to 2000 W
Lower RF: 1000 W to 2000 W The reason why the etching conditions for the entire surface etching are changed from the etching conditions for First Example, Second Example and first etching and second etching of Third Example solely lies in a fact that a nitride film in this case is formed considerably thick. With the above conditions, the etching rate of the nitride film is set high. It is a matter of course that, in the case that the etching time period is not particularly limited, the etching conditions for the entire surface etching can be the same as those for the first silicon oxide etching and the second silicon oxide etching.

Under these above conditions, the etching rate ratio in the direction of the depth, that is, the etching rate of the oxide film/the etching rate of the $Si_3N_4$ film is approximately 5.

After that, under the same conditions for the first silicon oxide etching, the second silicon oxide etching is carried out, and, thereby, the formation of a via hole is accomplished (FIG. 10(6)).

While the $Si_3N_4$ film in First Example is 2 nm to 5 nm in thickness, the $Si_3N_4$ film in Third Example is 20 nm in thickness. Further, in First Example and Second Example, the $Si_3N_4$ films formed on the sidewalls are thoroughly removed, but, in Third Example, the film is etched by mere 2 nm to 5 nm (FIG. 10(5)).

This results in a via hole having an aperture of approximately 0.15 µm, which is narrower than the aperture of 0.2 µm the hard mask has.

This makes the aspect ratio of the finished via hole 20 (3 µm/0.15 µm=20). Meanwhile, the height corresponding to the aspect ratios of 7 to 20, with which the bowing is liable to occur is 1.05 µm to 1.8 µm, and on the sidewall of the hole in this region, the $Si_3N_4$ film 116 still remains. In effect, a bowingless via hole with a high aspect ratio can be obtained.

What is claimed is:

1. A method of manufacturing a semiconductor device to fabricate, by performing dry etching, an opening with an aspect ratio of not less than 13 in a first insulating film of an oxide of silicon which is formed on a basic substance so as to reach said basic substance; which comprises the steps of:
    performing a first etching to form an opening section which reaches a depth where no bowing occurs in said first insulating film;
    forming a sidewall made of a third insulating film, which has a lower etching rate than said first insulating film, to protect said wall surface wherein said sidewall covers at least a region on said wall surface of said opening section corresponding to an aspect ratio of 2 to 7 when the formation of said opening section is completed; and
    performing a second etching to form an opening in said opening section by dry etching through at least the first insulating layer to reach a bottom film of a cylindrical capacitor.

2. A method of manufacturing a semiconductor device according to claim 1, wherein said first etching is applied through an opening formed in a second insulating film formed on said first insulating film.

3. A method of manufacturing a semiconductor device according to claim 2, wherein said first etching is stopped at an etching stopper layer formed within said first insulating film.

4. A method of manufacturing a semiconductor device according to one of claim 1, wherein said first insulating film of a silicon oxide film is made of one selected from the group consisting of silicon oxide, silicon oxynitride, non-doped silicate glass, silicate glass containing at least either of boron and phosphorus and silicon oxide formed by sintering siloxane.

5. A method of manufacturing a semiconductor device according to one of claim 1, wherein a second insulating film, said third insulating film and an etching stopper layer are each made of one selected from the group consisting of a polysilicon film, a silicon nitride film, a SiGe film and a Ge film.

6. A method of manufacturing a semiconductor device according to claim 1, wherein an aspect ratio of said opening section is not less than 7 but not greater than 12.

7. A method of manufacturing a semiconductor device according to claim 1, wherein said sidewall is made to remain on a wall surface of said opening.

8. A method of manufacturing a semiconductor device according to claim 1, wherein, in the step of performing said third removal, said sidewall is removed by etching.

9. A method of manufacturing a semiconductor device according to claim 8, wherein a film thickness of said sidewall is set thick enough to make the sidewall remain at least till said opening reaches said basic substrate.

10. A semiconductor device formed by a method of manufacturing a semiconductor device according to claim 1.

* * * * *